United States Patent
Wyland

[19]

[11] Patent Number: 5,986,885
[45] Date of Patent: Nov. 16, 1999

[54] SEMICONDUCTOR PACKAGE WITH INTERNAL HEATSINK AND ASSEMBLY METHOD

[75] Inventor: Christopher Paul Wyland, Morgan Hill, Calif.

[73] Assignee: Integrated Device Technology, Inc., Santa Clara, Calif.

[21] Appl. No.: 08/835,264

[22] Filed: Apr. 8, 1997

[51] Int. Cl.⁶ .................................................. H05K 7/20
[52] U.S. Cl. ..................... 361/704; 361/688; 361/690; 361/707; 361/709; 361/711; 361/718; 361/719; 257/687; 257/706; 257/707; 257/717; 257/720; 257/796
[58] Field of Search ...................... 361/704, 688, 361/689, 690, 709, 717, 718, 719, 722; 257/688, 692, 695, 706, 707, 717, 718, 719

[56] References Cited

U.S. PATENT DOCUMENTS

| | | | |
|---|---|---|---|
| 5,285,352 | 2/1994 | Pastore et al. | 361/707 |
| 5,291,062 | 3/1994 | Higgins et al. | 257/698 |
| 5,358,032 | 10/1994 | Arai et al. | 165/80.3 |
| 5,402,004 | 3/1995 | Ozmat | 257/717 |
| 5,430,331 | 7/1995 | Hamzehdoost et al. | 267/722 |
| 5,532,513 | 7/1996 | Smith et al. | 257/703 |
| 5,583,378 | 12/1996 | Marrs et al. | 257/718 |
| 5,598,321 | 1/1997 | Mostafazadeh et al. | 361/704 |
| 5,650,662 | 7/1997 | Edwards et al. | 257/712 |

OTHER PUBLICATIONS

Duocel brochure (2 pages), date prior to Apr. 1997.

*Primary Examiner*—Leo P. Picard
*Assistant Examiner*—Boris L. Chervinsky
*Attorney, Agent, or Firm*—Skjerven,Morrill,MacPherson, Franklin & Friel

[57] ABSTRACT

A semiconductor package includes a semiconductor die, a lead frame and die attach paddle, and a thermally conductive metal foam porous sponge attached to the die attach paddle to conduct heat generated by operation of the die to the outside of the semiconductor package. In another embodiment the chip is mounted directly on the sponge. A flip-chip interconnection is also disclosed. In the method, a die and lead frame assembly is placed on a sponge in the cavity of a package two-part mold, the mold is closed and filled with encapsulant. A ball grid array semiconductor package with an internal sponge heatsink mounted directly on or in a substrate such as a printed circuit board with circuitry metallization, and a semiconductor die, wire-bonded or soldered to the metallization and adhered to the sponge heatsink, is also included.

21 Claims, 4 Drawing Sheets

SEMICONDUCTOR PACKAGE WITH INTERNAL HEATSINK AND ASSEMBLY METHOD

FIELD OF THE INVENTION

The present invention relates to semiconductor packaging and, more particularly, to a semiconductor package provided with an internal heatsink that enhances the conduction of heat produced by internal operation to the outside of a semiconductor package. A method of manufacturing a semiconductor package having an internal heatsink is also provided.

BACKGROUND OF THE INVENTION

Semiconductor devices are often manufactured in package form, in which encapsulant materials provide environmental protection to the circuit. The encapsulant materials are exposed to heat generated by semiconductor devices during operation. The encapsulant materials are typically plastics, which are poor thermal dissipators.

Overheating can damage the semiconductor device, disrupting its operation and causing dangerous electrical shorts. In order to minimize the risk of overheating, some packages are provided with a heatsink or heat transfer system that conducts heat away from the semiconductor device to the outer surface of the package. These heat transfer systems generally take the form of metal slugs or strips embedded in the encapsulant material.

The typical heatsink or heat transfer system thus provides internal thermally conductive paths from the die to the outer surface of the package. These paths minimize the risk of overheating of the semiconductor devices as heat generated by the device during operation is conducted away from the device, and reduce the amount of nonconductive packaging through which heat must pass to reach the outer surface of the package.

The conductive paths of a typical heat transfer system are generally formed of thermally conductive metals, such as copper, embedded in the encapsulating material. These metals, though highly conductive, adhere poorly to the plastics commonly used as encapsulant materials. When the encapsulant layer does not adhere smoothly to the surface of the semiconductor device, air or moisture can collect in pockets between the encapsulant and semiconductor device and can damage the device and interfere with its operation.

Providing an anodized layer on the surface of the heatsink material can improve encapsulant adhesion. Mahulikar et al. (U.S. Pat. No. 5,367,196) describe a molded plastic semiconductor package including an aluminum or aluminum alloy heat spreader partially embedded in the molding resin. An anodization layer coating the aluminum or aluminum alloy heat spreader can be applied to improve the adhesion between the heat spreader and the molding epoxy. Mahulikar et al. also suggest alternative coatings which enhance adhesion.

However, the addition of an anodized layer or of additional coatings to improve adhesion is disadvantageous in that it adds complexity and cost to the manufacturing process. A heatsink made of material to which encapsulant material could smoothly adhere, without requiring anodization or additional adhesion layers, is clearly desirable.

The manufacture of a semiconductor package with an internal heatsink can also be costly due to the heatsink materials used. The construction of a heatsink can thus increase the associated costs of package manufacturing. In addition, heat transfer systems can be heavy and bulky, leading to an undesirable increase in the size and weight of the semiconductor package.

Ozmat (U.S. Pat. No. 5,402,004) describes a system for dissipating heat from multiple semiconductor chips disposed on a substrate. The substrate is in turn disposed on a metal matrix. The metal matrix rests on a housing in which an aluminum or copper sponge is secured. The housing contains a fluid inlet and outlet whereby fluid travels through the sponge and withdraws heat from the walls of the sponge cells.

A heat transfer system for use in semiconductor packages that is less complex in construction would be advantageous. A heat transfer system that is efficient in size and in cost is also desirable. In particular, a heat transfer system that uses smaller quantities of expensive metals can be produced less expensively and more efficiently. A heatsink material that provides a surface to which encapsulant materials can more securely adhere is also desired.

SUMMARY OF INVENTION

The present invention provides a semiconductor package with an internal heatsink. In one embodiment, the semiconductor package includes a lead frame having leads and a die attach paddle. A semiconductor die having a first surface with bonding pads positioned thereon is mounted on a first surface of the die attach paddle. Each bonding pad is connected by bond wire or an interconnect to a corresponding lead of the lead frame. A thermally conductive sponge is positioned on an opposite second surface of the die attach paddle. For example, an upper surface of the sponge may contact a lower surface of the die attach paddle. The thermally conductive sponge can be formed of a porous metal foam material.

The die, the bonded portion of the leads, the die attach paddle, the bonding wires, and the thermally conductive sponge are encapsulated in an encapsulant molding resin. The encapsulant can leave a part of the sponge exposed to the environment to enhance conduction and radiation of heat away from the package. Typically, a portion of the lead frame is trimmed off the finally assembled package in order to electrically isolate the leads extending from the encapsulated package from one another.

The area of the upper surface of the thermally conductive sponge can be smaller than the area of the lower surface of the die attach paddle in order to reduce the overall dimensions of the package. The sponge can be secured to the lower surface of the die attach paddle with an adhesive or can be held in position by the encapsulant in a resin-molding step.

In another embodiment, a semiconductor package using a flip-chip interconnection between the die and a substrate is provided. Bonding pads on the first surface of the die are electrically connected to interconnection balls on the second surface of the substrate, which in turn interconnect the package to other electrical components.

The second surface of the die is mounted directly onto a thermally conductive sponge, and is secured with a layer of thermally conductive adhesive. A layer of encapsulant covers the exposed portions of the sponge first surface and die, and at least a portion of the substrate first surface.

In another embodiment, a thermally conductive sponge is mounted onto a substrate. A portion of the sponge first surface is exposed by an aperture in the substrate. A die is mounted onto the sponge at this exposed portion, and an electrically conductive pathway connects the die to interconnection balls on a second surface of the substrate. A layer of encapsulant covers the exposed portions of the die and sponge first surface, and at least a portion of the substrate first surface. In an alternative embodiment, the heatsink is cut to the size of the aperture in the substrate and is mounted therein.

The sponge heatsink of the present invention provides a thermally conductive internal path through which heat generated by the die is transferred to the exterior surface of the package. In addition, the porous surface of the metal sponge has excellent molding resin locking capability due to the molding pressure and encapsulant flowing into the interstices of the metal sponge and provides an improved adhesion surface for the encapsulant.

In accordance with the present invention, a method for manufacturing a semiconductor package having an internal heatsink is also presented. The method includes providing a lead frame having leads and a die attach paddle. A die is mounted on the upper surface of the die attach paddle, the die having a first surface with bonding pads formed thereon. Each bonding pad is connected by bond wires to a corresponding lead of the lead frame.

A thermally conductive sponge of the desired size for the heatsink is placed in a cavity of a package mold. The die and lead frame are placed on top of the sponge in the mold. The mold is then closed and filled with encapsulant with the lead fingers extending from the mold, and the package manufacture proceeds by any conventional method. Typically, a portion of the lead frame is trimmed off the finally assembled package in order to electrically isolate the leads from one another.

The method can further include securing the sponge to the lower surface of the die attach paddle. In an alternative method, the die can be mounted directly onto the sponge in a central aperture of the lead frame. The sponge, typically of foamed aluminum, can also be anodized in order to be made non-electrically conductive. This removes the risk of an electrical short if the leads accidentally contact the heatsink. Anodization also provides a roughened surface which further improves encapsulant adhesion.

Another embodiment of the present method includes providing a flip-chip interconnection between a die and a substrate. Bonding pads on a first surface of a die are electrically connected to interconnection balls on a second surface of the substrate. The second surface of the die is mounted directly onto a first surface of a thermally conductive sponge with a layer of thermally conductive adhesive. A mold is placed over the sponge and die on the substrate and filled with encapsulant material. The package finishing proceeds by any conventional method.

A method for manufacturing a semiconductor package in which the heatsink is secured to the substrate is also provided. According to this method, the first surface of a thermally conductive sponge is mounted onto a substrate first surface and secured thereon with a layer of thermally conductive adhesive. A portion of the first surface of the sponge is exposed at an aperture in the substrate, and a die is mounted onto the sponge at this exposed portion. An electrically conductive pathway is formed between the die and interconnection balls on a second surface of the substrate. The exposed portions of the die and the sponge first surface, and at least the portions of the substrate defining the aperture are then encapsulated with a layer of encapsulant. In an alternative method, the sponge heatsink is cut to the appropriate size to be inserted into the aperture in the substrate and is secured there with a thermally conductive adhesive. The die is mounted onto the sponge, and manufacture proceeds as discussed above.

In the second embodiments the thermally conductive sponge is utilized in a ball grid array (BGA) package. As to one BGA embodiment a semiconductor chip is provided in a flip chip configuration with interconnects such as ball bonds extending from one surface of the chip interconnecting pads on the chip, with contact pads on metallization on a first surface of a printed circuit board (PCB). The metallization circuitry extends to plated through-holes or vias in the PCB to an underside of the board where bond balls are affixed for contacting and for being reflowed into connection with a mother board or the like. A thermally conductive sponge is adhesively attached to a second surface of the chip opposite the first surface by thermally conductive adhesive and molded encapsulant provided over the chip, the interconnection with the PCB, preferably over the peripheral edges of the sponge and over at least a portion of the PCB top surface opposite the bottom surface including the array of balls.

In another embodiment a flip chip is provided in an inverted cavity in the PCB where the chip bonding pads are wire bonded to metallization on a PCB first surface. By suitable plated through-holes or vias in the PCB, signals are then conveyed to an array of balls on the PCB bottom surface. An insulative encapsulant is then provided in the cavity covering and firmly holding the bond wires, the chip and a surface of the sponge facing the chip. As in the previous embodiment the sponge is attached to the non-bonding pad side of the chip. In still another embodiment similar to the last described embodiment a thermally conductive sponge is attached to both the chip non-bonding pad side and to the PCB first surface, such side and first surface being in a common plane.

In another embodiment no die attached paddle is provided. Rather the semiconductor chip is directly attached by suitable thermally conductive adhesive to the thermally conductive sponge and bonding pads on the chip wire bonded to appropriate lead frame fingers. The package is completed by encapsulating the chip, the wire bonds, inner portions of the lead frame fingers and the peripheral edges of the thermally conductive sponge.

Manufacturing a semiconductor package with an internal heatsink using the claimed methods reduces the cost and time of manufacture, and provides improved encapsulant adhesion. A device according to the present method can thus be produced more cheaply and is more stable in operation than prior art devices.

These and other objects, features, and advantages of the present invention will be more readily apparent from the detailed description of the invention set forth below taken in conjunction with the accompanying drawings.

DETAILED DESCRIPTION OF THE INVENTION

Figure 1:
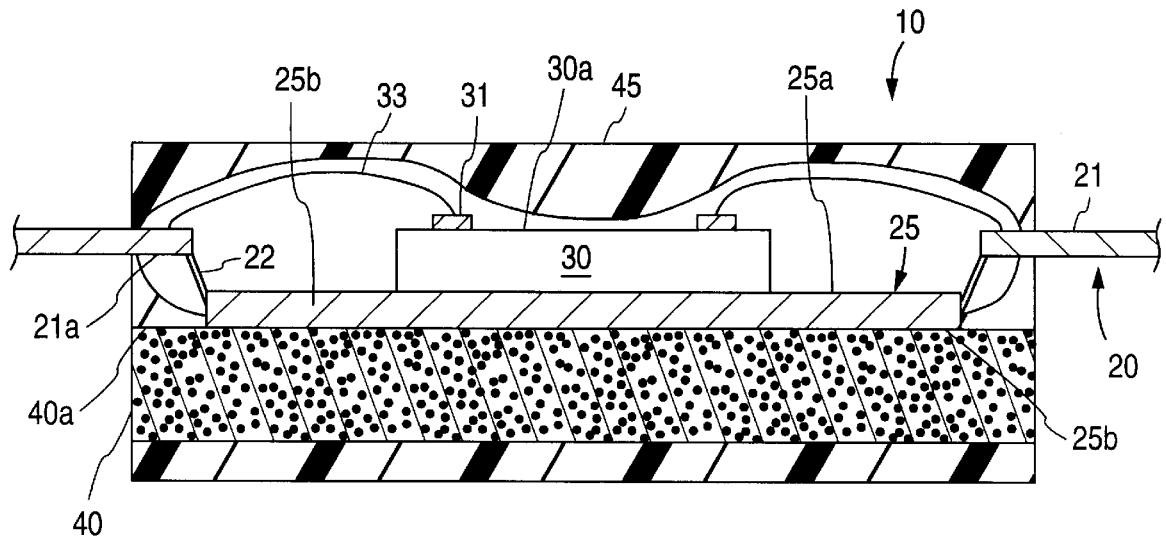
FIG. 1 is a cross-sectional view taken on line 1—1 of FIG. 2 of a semiconductor package in accordance with one embodiment of the present invention.

In accordance with the present invention, a semiconductor package with an internal sponge heatsink and a method for manufacturing the same are provided. Several elements shown in the following figures are substantially similar. Therefore, similar reference numbers are used to represent similar elements. FIG. 1 is a cross-sectional view of a semiconductor package 10 in accordance with one embodiment of the present invention. Package 10 includes a lead frame 20 having conductive leads 21, die paddle supports or tie bars 22, and thermally conductive die attach paddle 25.

Lead frame 20 is formed from a thermally conductive material such as copper. Lead frame 20, tie bars 22, and die attach paddle 25 are typically of an integrated one-piece construction. Unwanted parts are stamped out from a single strip of copper, leaving the lead frame including output terminals such as leads or lead fingers 21, tie bars 22, and die attach paddle 25. Lead frame 20 and die attach paddle 25 can also be formed by any conventional method. If desired, the die attach paddle 25 can be formed of a different thermally conductive material from the leads 21.

Die 30 having a first surface 30a with die bonding pads 31 is attached to first surface 25a of die attach paddle 25 with a thermally conductive adhesive. The adhesive is suitably an epoxy adhesive. A silver-filled epoxy adhesive, such as Ablestick 84-1 or an equivalent, is preferred. Generally an adhesive having a thermal conductivity of from about 0.3 to about 5 watts/meter° C. is preferred. Each die bonding pad 31 is wire bonded to a respective lead of the lead frame 20 by bonding wire 33. A thermally conductive sponge contacts the second surface 25b of the die attach paddle.

In FIG. 1, the thermally conductive sponge 40, namely a thermally conductive, porous metal foam of a stiffness so that it is self-supporting, serves as an internal heatsink for the semiconductor package. Suitable metal foams can be aluminum or aluminum-based. Aluminum alloys such as 6101 or A356 can be used. An exemplary metal foam is DUOCEL foam, available from Energy Research and Generation, Oakland, Calif. As shown in FIG. 1, first surface 40a of metal sponge 40 is slightly larger in area than the area of second surface 25b of die attach paddle 25. A sponge metal having a density range of from about 2.5% to about 10% is preferred.

Metal sponge 40 is placed in close contact with the second surface 25b of die attach paddle 25. First surface 40a of sponge 40 can be adhesively bonded to die attach paddle 25 with a thermally conductive adhesive, such as an epoxy. Epoxies suitable for use include StayStick from Stay Stick of Santa Ana, Calif., Nos. 301 and 373, or Ablestick 84-1 from Ablestick, Inc., of Rancho Domingues. A range of thermal conductivity of the heatsink sponge of from about 6 to about 20 watts/meter° C. is contemplated.

An encapsulant 45 is applied over the entire assembly. In particular, die attach paddle 25, die 30 and die bonding pads 31, bonding wires 33, tie bars 22, the bonded portion 21a of each lead 21, and at least a portion of metal sponge 40 are encapsulated. The encapsulant 45 is formed of any conventionally used encapsulant-forming resin molding material. Suitable encapsulants include epoxy resins such as Sumitomo 6300 or 9600 from Sumitomo Ltd. of Santa Clara, Calif. A portion of the lead frame is typically trimmed after solidification and curing of the encapsulant in order to electrically isolate the leads from one another.

Due to its porous nature, metal sponge 40 provides an excellent adhesion surface for the encapsulant 45. The encapsulant material seeps into the pores of metal sponge 40, and the encapsulant 45 thus adheres closely to first surface 40a facing the paddle and the interstices of the sponge. The cost of fabricating each individual package can be reduced by proper sizing of metal sponge 40. In particular, when using a sponge sized to correspond to the dimensions of the die and die attach paddle assembly, unnecessary excess of expensive metal materials is minimized or essentially eliminated. For example, a typical semiconductor package such as a plastic quad flat pack, has a thickness of about 133 mils, measured from the lower surface of the heatsink to the top surface of the encapsulant. The die itself generally has a thickness of about 20–25 mils, and the die attach paddle a thickness of about 6 mils. A sponge heatsink suitable for use in the present invention can therefore be about 60 mils thick. A range of sponge heatsink thicknesses of from about 30 mils to about 60 mils is preferred. Accordingly, the amount of metal sponge used in the production of a semiconductor package according to the present invention can be minimized to about one-sixteenth of a cubic inch. Less metal is used than in the metal slug heatsinks previously used in other semiconductor devices, and the materials costs associated with manufacturing a device according to the present invention are consequently reduced.

Figure 2:
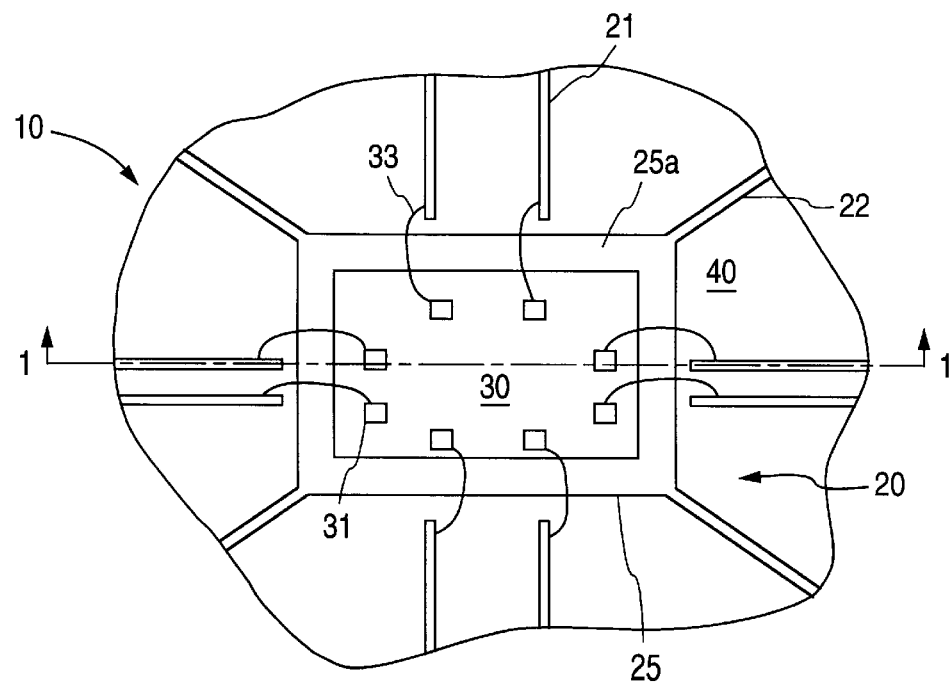
FIG. 2 is a top view of an embodiment of a semiconductor package according to the present invention, shown without the encapsulant molding resin.

FIG. 2 is a top view of a semiconductor package 10 in accordance with the present invention, shown without the encapsulant. Lead frame 20 includes leads 21, die paddle supports (tie bars) 22, and die attach paddle 25. Die 30 is mounted on the first surface 25a of die attach paddle 25. Bonding pads 31 on the surface of die 30 are electrically connected to corresponding leads by bond wires 33 using conventional wire bonding techniques. The bonding wires can be gold or any other conventionally used material. In a preferred embodiment, the bonding wires are gold.

Figure 3:
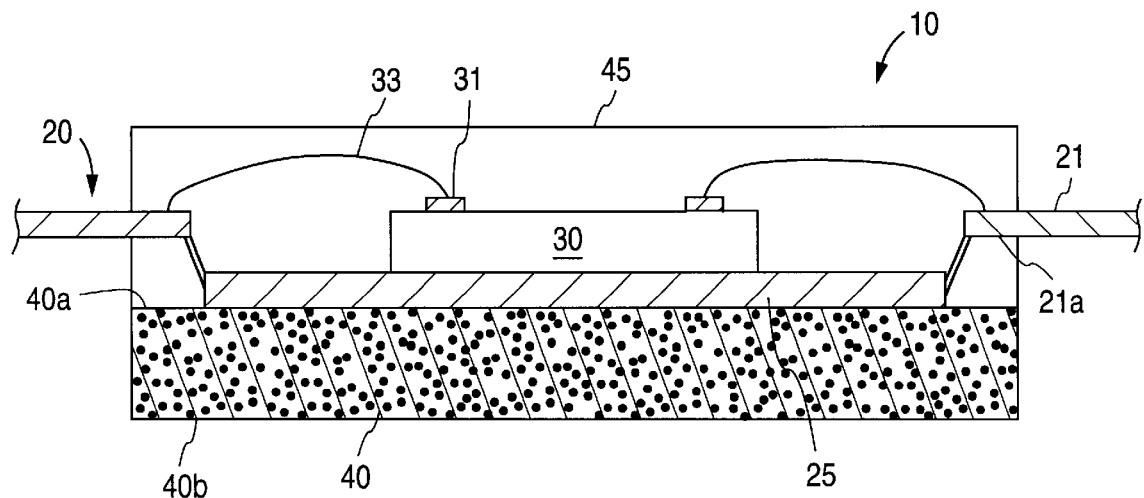
FIG. 3 is a cross-sectional view of a semiconductor package in accordance with one embodiment of the present invention, shown with the encapsulant molding resin not hatched, in which a portion of the sponge heatsink is exposed to the environment.

FIG. 3 shows a preferred embodiment of a semiconductor package 10 in accordance with the present invention, in which a portion of sponge 40 is exposed to the environment in order to enhance conduction and radiation of heat away from the semiconductor device. In the particular embodiment shown, the second surface 40b of metal sponge 40 is not covered by encapsulant 45 and is exposed to the environment.

Figure 5:
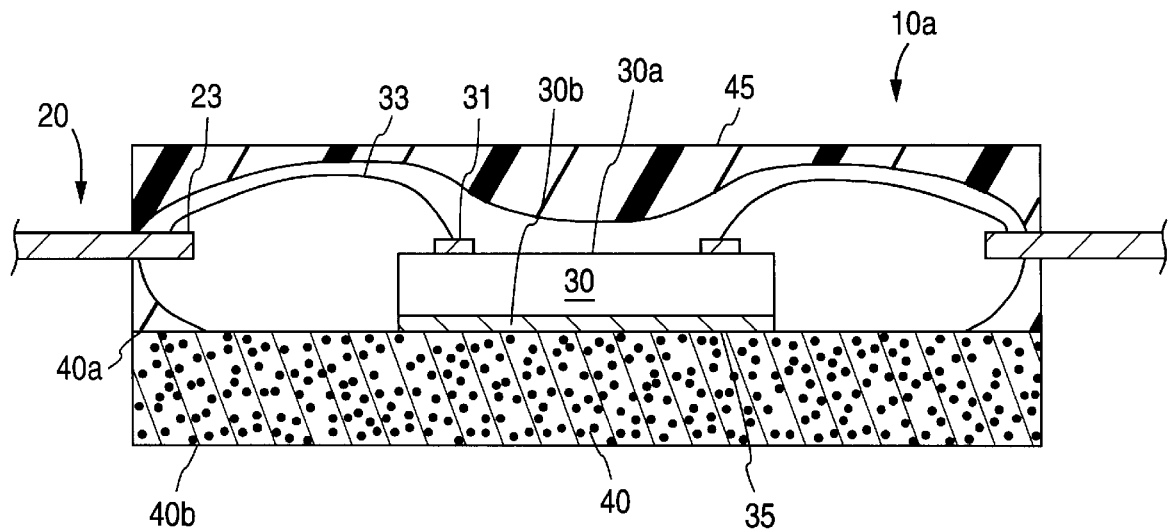
FIG. 5 is a cross-sectional view of an embodiment of a semiconductor package in accordance with the present invention in which a semiconductor die is mounted directly onto the heatsink in a central aperture of the lead frame.

In the embodiment of a semiconductor package 10a according to the present invention shown in FIG. 5, die 30 is mounted directly onto sponge 40 in a central aperture 23 of lead frame 20. Second surface 30b of die 30 can be secured to first surface 40a of sponge 40 with a layer of thermally conductive adhesive 35. Suitable thermally conductive adhesives include those discussed above for securing sponge 40 to die attach paddle 25. The porous sponge 40 has excellent mold locking capabilities. The encapsulant fills the interstices of the sponge, adhering smoothly to package 10a, and preventing moisture from entering the interior of the package and causing delamination of the encapsulant layer 45 from package 10a. Second surface 40b of the heatsink sponge is exposed to the environment in order to enhance the conduction of heat to the exterior of package 10a and the radiation of heat away from the package. In all other aspects, package 10a is substantially similar to package 10 in FIG. 1.

Figure 6:
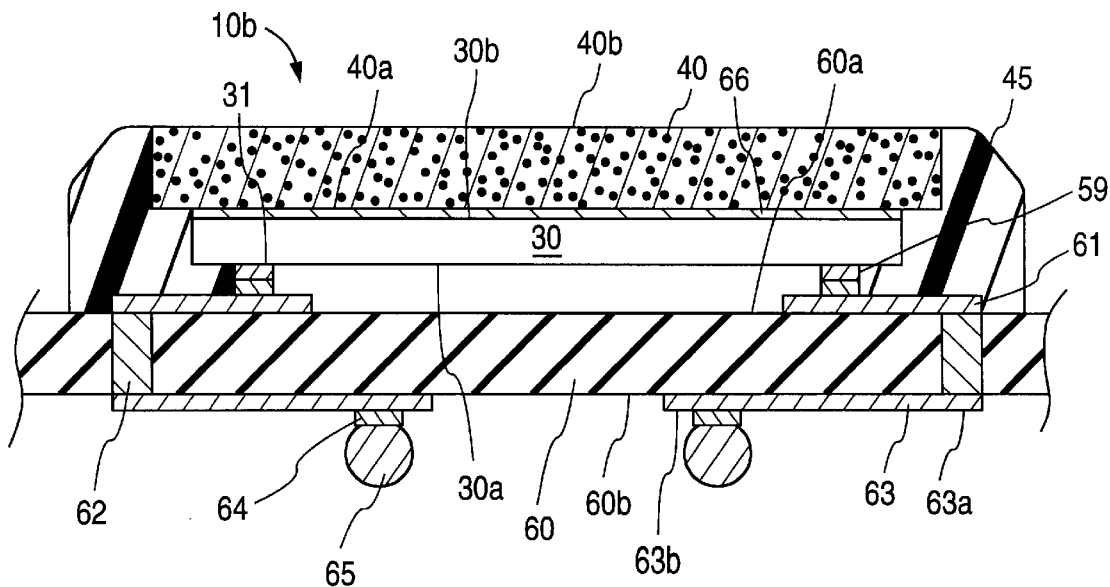
FIG. 6 is a cross-sectional view of a ball grid array semiconductor package according to the present invention in which a flip-chip interconnection is formed between the die and a substrate.

FIG. 6 is a cross-sectional view of a semiconductor package 10b in which a flip-chip interconnection is formed in accordance with an alternative embodiment of the present invention. Semiconductor die 30 is mounted to substrate 60 using a flip-chip connection in which first surface 30a of die 30 is placed adjacent first surface 60a of substrate 60. Bonding pads 31 are electrically connected to first circuitry metallizations 61 forming part of electrical interconnects by any conventional means, such as by solder 59.

Substrate 60 is typically a printed circuit board (PCB) substrate material. However, conventionally used ceramic, plastic laminate such as alumina or BT resin, or passivated metal substrates can also be used. Substrate 60 has electrically conductive through-holes 62. Through-holes 62 can be formed, for example, by drilling holes in substrate 60 and then plating the holes with a conductive material. A suitable conductive material is copper.

Through-holes 62 extend from the first surface 60a of the substrate to the second surface 60b of the substrate. Electrically conductive circuitry metallizations 61 are formed on first surface 60a, and are electrically connected to corresponding through-holes 62. The first metallizations 61 are formed of a suitable electrically conductive material such as copper.

Second circuitry metallizations 63, typically formed of an electrically conductive material such as copper, are formed on second surface 60b of the substrate. Each second metallization 63 is electrically connected at a first end 63a to a corresponding through-hole 62. A contact 64 is formed at an opposite second end 63b of each second metallization 63.

Contacts 64 are preferably a layer of gold or a multi-layer metallization such as nickel with a gold outer layer, and can be formed using conventional processes such as electroplating. Interconnection output terminals such as balls 65 are formed on contacts 64. Each interconnection ball 65 is electrically connected to the second end 63b of a corresponding second metallization 63 by a contact 64. The interconnection balls are typically formed of 63% tin=37% lead eutectic solder. The interconnection balls interconnect package 10b and other electrical components (not shown). Interconnection balls 65 are typically arranged in an array, forming a ball grid array (BGA).

Sponge heatsink 40 is mounted directly onto die 30. The first surface 40a of sponge 40 is secured to the second surface 30b of die 30 with a layer of thermally conductive adhesive 66. Suitable thermally conductive adhesives include those discussed above for securing sponge 40 to die attach paddle 25. Surface 40b of sponge 40 is exposed to the environment in order to enhance the conduction of heat through the internal path provided by the sponge heatsink and the radiation of heat away from package 10a.

At least a portion of first surface 60a of substrate 60, first surface 30a of die 30, and first surface 40a of sponge 40, bonding pads 31, and metallizations 61 are encapsulated in a layer of encapsulant 45. Suitable encapsulants include those discussed above, which are molded on the package by a standard molding process, as suitable encapsulants for the embodiment shown in FIG. 1.

Figure 7:
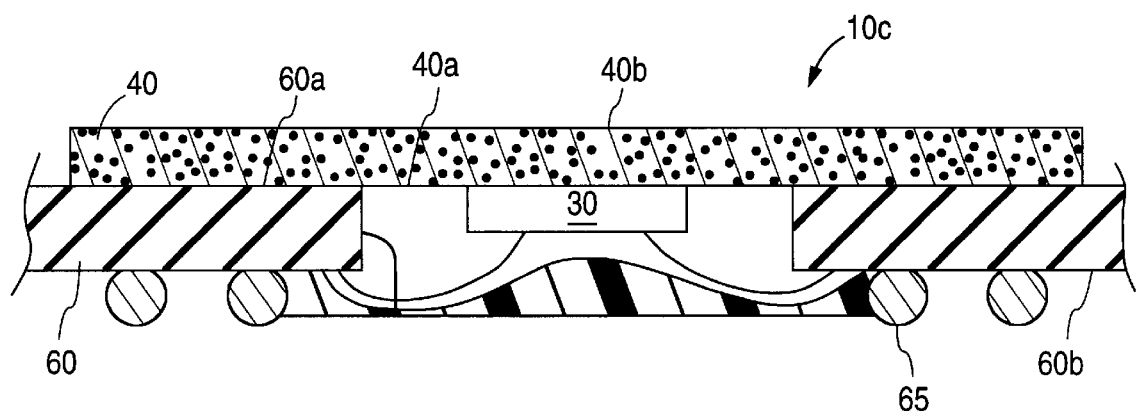
FIG. 7 is a cross-sectional view of another embodiment of a ball grid array semiconductor package according to the present invention in which the sponge heatsink is mounted directly onto a substrate.

FIG. 7 shows a cross-sectional view of package 10c, another embodiment of a semiconductor package according to the present invention. First surface 40a of sponge heatsink 40 is mounted onto substrate 60 using a thermally conductive adhesive, such as the adhesive materials already described. A portion of surface 40a is exposed at an aperture 67 in substrate 60. The die 30 is mounted as previously described onto the exposed portion of sponge surface 40a.

An electrically conductive pathway is formed between the die and interconnection balls 65. The electrically conductive pathway is typically formed by a series of metallizations and vias (not shown) as is well known to those skilled in the art.

A layer of encapsulant 45 encapsulates at least the portions of substrate 60 defining aperture 67, and the exposed portions of die 30 and an inner part of surface 40a of sponge 40. The encapsulant material fills the interstices of thermally conductive sponge 40, providing excellent interlocking between the sponge heatsink and encapsulant layer. This enhances the environmental protection of the package by preventing moisture from entering the package and causing delamination of the encapsulant layer. Surface 40b of sponge 40 is exposed to the environment in order to facilitate conduction of heat produced in operation to the surface of and away from semiconductor package 10c.

Figure 8:
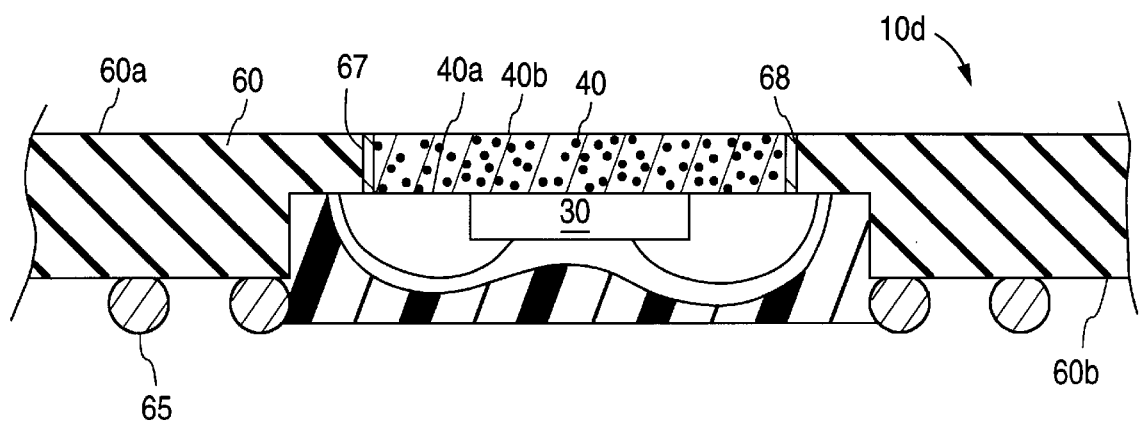
FIG. 8 is a cross-sectional view of another embodiment of a ball grid array semiconductor package according to the present invention in which the sponge heatsink is mounted within an aperture in a substrate.

A similar embodiment is shown in FIG. 8. Package 10d includes a substrate 60 having an aperture 67. Sponge 40 is mounted within the aperture, and the edges of the sponge are secured to the edges of the substrate defining aperture 67 with a thermally conductive adhesive 68. Again, appropriate thermally conductive adhesives include the adhesive materials previously discussed. Due to the excellent interlocking capabilities of the sponge material, the sponge heatsink 40 is securely adhered to the edges of substrate 60 that define aperture 67.

Die 30 is mounted directly onto surface 40a of the sponge as described in previously discussed embodiments. The die 30 is connected to interconnection balls 65 through an electrically conductive pathway of conventional construction, such as that described above for the embodiment illustrated in FIG. 6.

A layer of encapsulant covers at least the exposed portions of the die 30 and sponge surface 40a, and a portion of substrate 60. The encapsulant fills the interstices of sponge heatsink 40, securely adhering encapsulant layer 45 to the package 10d. This secure adhesion prevents moisture from entering the package, and protects against corresponding delamination of the encapsulant layer. In the embodiment as shown in FIG. 8, surface 40b of sponge 40 is not encapsulated, but is exposed to the environment to enhance the thermally conductive properties of the heatsink 40.

Thermally conductive metal sponge 40 is light in weight and highly porous and has excellent mold locking capabilities. This also prevents moisture from entering into the die surfaces and any resultant delamination. The internal heatsink of the present invention thus promotes smooth and secure adhesion of the encapsulant, as well as providing an excellent internal conductive pathway that directs heat generated by operation of the semiconductor device to the outside of the package.

Figure 4:
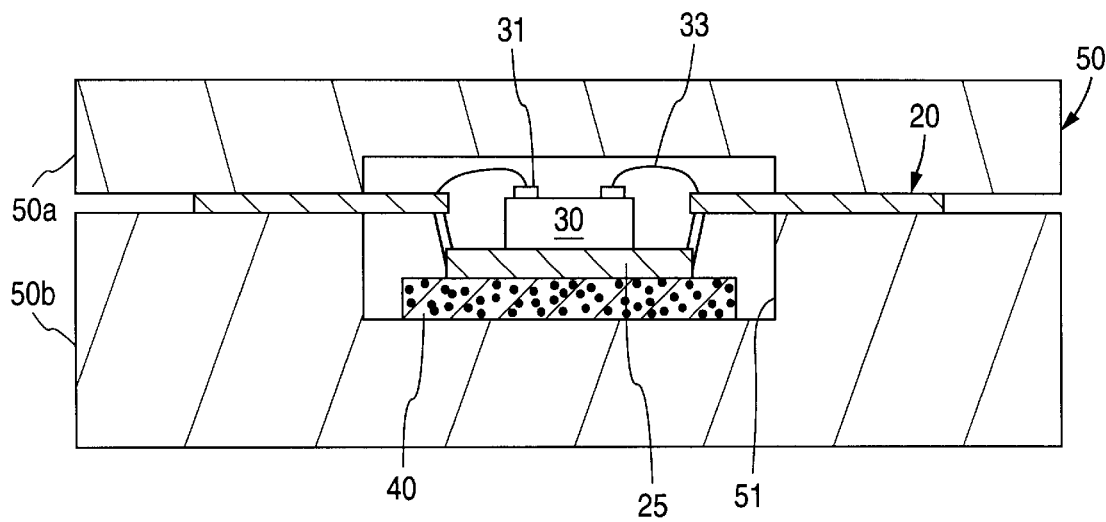
FIG. 4 is a cross-sectional view of the lead frame, die, and sponge assembly of FIG. 1 disposed in the mold cavity of a closed mold.

In accordance with the present invention, a method for manufacturing a semiconductor package is also presented. FIG. 4 shows a cross-sectional view of the lead frame, die, and sponge assembly of FIG. 1 disposed in the mold cavity of a closed mold 50. Metal sponge 40 is placed in the cavity 51 of package mold 50. Lead frame 20, die attach paddle 25, and die 30, with associated bonding pads 31 and bonding wires 33, are placed on top of metal sponge 40 in mold cavity 51. The two halves 50a and 50b of the mold are then closed and filled with encapsulant material through a suitable mold gate (not shown), which material upon cooling, curing, and solidifying forms the encapsulated package. A portion of the lead frame can be trimmed to electrically isolate the leads from one another.

Referring to FIG. 1, the present method of manufacture can also include the step of securing first surface 40a of metal sponge 40 to second surface 25b of the die attach paddle. The sponge can be adhesively affixed to the second surface of the die attach paddle 25 with a thermally conductive adhesive such as those used above to adhere the die to the first surface of the die attach paddle. In the method of manufacture corresponding to the embodiment shown in FIG. 5, the die is affixed directly to the sponge in a central aperture 23 of lead frame 20 rather than to a die attach paddle.

An anodizing step can also be added, wherein aluminum or aluminum alloy metal sponge 40 is anodized, electrically isolating leads 21 and removing the risk of an electrical short if the leads accidentally contact the metal sponge. The anodized insulative layer will be about a micron in thickness and will not be deleterious to the needed heat transfer.

Referring to FIG. 6, in another embodiment of the present method, a flip-chip interconnection is formed between die 30 and substrate 60. Each bonding pad 31 is electrically connected to a respective first metallization 61 on the first surface 60a of substrate 60. Each first metallization 61 is electrically connected to a corresponding through-hole 62, which in turn is electrically connected to the first end 63a of a second metallization 63 on the second surface 60b of the substrate. A contact 64 is formed on the second end 63b of each second metallization 63 and is electrically connected to an interconnection ball 65. Therefore, an electrically conductive pathway is formed from each bonding pad 31 on the first surface 30a of the die to an interconnection ball 65.

Metal sponge 40 is mounted directly onto second surface 30b of die 30. First surface 40a of the heatsink can be secured to the die second surface 30a with a layer of an adhesive 66 such as the thermally conductive epoxies previously discussed. At least a portion of substrate surface 60a and sponge surface 40a, the bonding pads 31, and first metallizations 61 are then encapsulated with a layer of encapsulant. Typically, a mold is placed over the die mounted on the substrate, and encapsulant material is injected into the mold cavity. Manufacture proceeds according to conventional methods.

Another method in accordance with the present invention provides for the manufacture of a semiconductor package, preferably of rectangular shape with an internal heatsink such as package 10c in FIG. 7. In this method, first surface 40a of thermally conductive sponge 40 is mounted on first surface 60a of a substrate 60 in a coplanar arrangement, and secured thereon as previously described. An aperture 67 in the substrate 60 exposes a portion of sponge first surface 40a, and die 30 is mounted on the sponge at this exposed portion. An electrically conductive pathway (not shown) is formed between the die and interconnection balls 65 on the second surface 60b of substrate 60. The construction of such pathways is known to those of ordinary skill in the art. The balls 65 extend outwardly of inverted cavity 67 and the encapsulant 45.

The method further includes encapsulating the exposed portions of sponge surface 40a and die 30, and at least the portions of substrate 60 that define aperture 67. Any conventional method of encapsulation is appropriate. In an alternative method for the manufacture of a semiconductor package 10d such as that shown in FIG. 8, a thermally conductive sponge 40 is cut to the size of aperture 67. Sponge 40 is then fitted into aperture 67 and is secured therein with layers of thermally conductive adhesive 68. Die 30 is mounted on surface 40a of the heatsink 40. The sponge, die, and substrate assembly is encapsulated as described above.

Although the present invention has been described with reference to the preferred embodiments, persons skilled in the art will recognize that changes may be made in form and detail without departing from the spirit and scope of the invention. For example, the sponge can be of any dimension suitable to the particular package, i.e. the first surface of the sponge can be larger or smaller than the second surface of the die attach paddle. In addition, in embodiments using flip-chip interconnections, the region between die 30 and substrate 60 can be filled with an epoxy to eliminate air pockets under the die in which moisture can collect.

I claim:

1. A semiconductor package comprising:
   a self-supporting metal foam thermally conductive sponge having a porous adhesion surface;
   a semiconductor die having bonding pads, said die being in thermal connection to said sponge;
   electrical interconnects extending from said bonding pads to output terminals; and
   an insulative encapsulant surrounding said die, said interconnects and extending into interstices of the porous adhesion surface of said sponge.

2. The package of claim 1 wherein said output terminals include a lead frame having lead frame fingers and wherein the electrical interconnects include bonding wires.

3. The package of claim 1 further including a printed circuit board having circuitry metallization on a surface thereof and wherein said output terminals include a ball grid array extending from said printed circuit board.

4. The package of claim 3 in which said electrical interconnects are bonding wires.

5. The package of claim 3 in which said electrical interconnects are solder balls extending from said bonding pads to said metallization.

6. The package of claim 3 wherein said printed circuit board includes a cavity, said die being positioned in said cavity and wherein after assembly said sponge and said encapsulant is sealed within said cavity.

7. The package of claim 6 wherein said ball grid array surrounds said cavity and the encapsulant.

8. The package of claim 1 wherein said output terminals include a lead frame having a die paddle, said paddle being positioned between said die and said sponge and wherein said die is attached to one surface of said paddle and said sponge is attached to an opposite surface of said paddle.

9. A semiconductor package comprising:
   a die having a first surface and a second surface;
   a plurality of bonding pads on the first surface of the die;
   a thermally conductive sponge having a first surface and a second porous adhesion surface, the first surface of the thermally conductive sponge positioned in direct or indirect thermal contact with the second surface of the die; and
   an encapsulant which encapsulates the die, the bonding pads, and at least a portion of the thermally conductive sponge second porous adhesion surface.

10. The semiconductor package of claim 9 further comprising:
a plurality of leads, each lead connected to one of the bonding pads at a bonding portion of the lead; and a die attach paddle having a first surface and a second surface, wherein the die is mounted on the first surface of the die attach paddle, the thermally conductive sponge is secured to the second surface of the die attach paddle, and the encapsulant additionally encapsulates the bonding portion of the leads.

11. The semiconductor package of claim 10 wherein each lead is connected to one of the bonding pads with a bonding wire.

12. The semiconductor package of claim 11 where the bonding wire is gold.

13. The semiconductor package of claim 9 wherein the thermally conductive sponge has a range of thermal conductivity of from about 6 to about 20 watts/meter° C.

14. The semiconductor package of claim 9 wherein the thermally conductive sponge is aluminum or an aluminum-based alloy.

15. The semiconductor package of claim 14 wherein the thermally conductive sponge is foamed aluminum.

16. The semiconductor package of claim 14 wherein a portion of the thermally conductive sponge adjacent the leads is anodized.

17. The semiconductor package of claim 9 further comprising:
a substrate having a first surface and a second surface, the first surface of the substrate electrically contacting the first surface of the die;
a plurality of interconnection balls formed on the second surface of the substrate; and
an electrically conductive pathway connecting each bonding pad to one of the interconnection balls, wherein the second surface of the die is mounted on the first surface of the thermally conductive sponge, and the encapsulant additionally encapsulates at least a portion of the first surface of the substrate.

18. The semiconductor package of claim 9 further comprising:
a substrate having a first surface, a second surface, and an aperture, the first surface of the substrate contacting the first surface of the thermally conductive sponge;
a portion of the first surface of the thermally conductive sponge being located in the aperture in the substrate; and
a plurality of interconnection balls formed on the second surface of the substrate, wherein the second surface of the die is mounted on an exposed portion of the first surface of the thermally conductive sponge, each bonding pad being electrically connected to one of the interconnection balls, and the encapsulant additionally encapsulates at least a portion of the substrate within the aperture.

19. The semiconductor package of claim 18 wherein the thermally conductive sponge is sized to fit within the aperture in the substrate and is secured therein.

20. The semiconductor package of claim 9 wherein the thermally conductive sponge is a self-supporting metal foam sponge.

21. The semiconductor package of claim 10 wherein the die attach paddle and the leads are part of a lead frame.

* * * * *